United States Patent [19]

Oritani

[11] Patent Number: 4,651,029
[45] Date of Patent: Mar. 17, 1987

[54] DECODER CIRCUIT

[75] Inventor: Atsushi Oritani, Yokohama, Japan

[73] Assignee: Fujitsu Limited, Kawasaki, Japan

[21] Appl. No.: 847,107

[22] Filed: Apr. 3, 1986

Related U.S. Application Data

[63] Continuation of Ser. No. 560,173, Dec. 12, 1983, abandoned.

[30] Foreign Application Priority Data

Dec. 27, 1982 [JP] Japan ................... 57-226607

[51] Int. Cl.$^4$ ................. H03K 19/094; H03K 19/096; H03K 19/20; G11C 8/00
[52] U.S. Cl. .................... 307/449; 307/279; 307/269; 307/443; 365/230
[58] Field of Search ............... 307/449, 463, 450, 270, 307/448, 269, 279, 443; 365/230

[56] References Cited

U.S. PATENT DOCUMENTS

| | | | |
|---|---|---|---|
| 3,651,342 | 3/1972 | Dingwall | 307/451 X |
| 3,911,289 | 10/1975 | Takemoto | 307/451 |
| 4,024,512 | 5/1977 | Amelio et al. | 307/463 X |
| 4,099,265 | 7/1978 | Abe | 307/279 X |
| 4,247,921 | 1/1981 | Itoh et al. | 307/463 X |
| 4,398,102 | 8/1983 | Stewart | 307/449 |
| 4,404,474 | 9/1983 | Dingwall | 307/449 X |
| 4,446,386 | 5/1984 | Kurafuji | 307/449 |
| 4,467,225 | 8/1984 | Tanaka | 307/449 X |
| 4,471,240 | 9/1984 | Novosel | 307/449 X |

FOREIGN PATENT DOCUMENTS 113481  7/1982  Japan ..................... 365/227

OTHER PUBLICATIONS

Pashley et al., "A 16K×1b Static RAM"; Session 1X: Static RAMs; *IEEE-ISSCC'79*, 2/15/1979; *Digest of Tech. Papers*.

Primary Examiner—Larry N. Anagnos
Attorney, Agent, or Firm—Staas & Halsey

[57] ABSTRACT

A decoder circuit used in a semiconductor memory device including a first and second voltage terminals; a NOR gate circuit including a plurality of inverter transistors for receiving address signals and connected in parallel between the first voltage terminal and a common output node, and a positive feedback transistor for positively feeding back a signal on the common output node and operatively connected between the second voltage terminal and the common output node; and a device operatively connectd between the second voltage terminal and the common output node, for conductively connecting the second voltage terminal to the node for a predetermined period in response to the changing of the address signals.

6 Claims, 6 Drawing Figures

DECODER CIRCUIT

This is a continuation of co-pending application Ser. No. 560,173 filed on Dec. 12, 1983 now abandoned.

BACKGROUND OF THE INVENTION

1. Field of the Invention

The present invention relates to a decoder circuit, more particularly, to a decoder circuit used as a peripheral circuit of a semiconductor memory device e.g., a metal-oxide semiconductor (MOS) type static random access memory (RAM) (MOS-static RAM), which can operate on greatly reduced power consumption when in a non-selected condition.

2. Description of the Prior Art

Recently, semiconductor memory devices, for example MOS-static RAM's, have been produced with a greater bulk storage capacity and higher degree of integration. However, this greater bulk storage capacity and higher degree of integration causes a corresponding increase in the power consumption per one memory chip. The increased power consumption by the memory chips brings about a greater radiation of heat, i.e., a higher calorific value, so that a large-scale cooling means becomes necessary for cooling the memory chips effectively. Moreover, the larger the number of memory chips used in the mass storage semiconductor memory device, the greater the power consumption and the higher the calorific value.

Consequently, problems occur in that the conventional decoder circuit used as one of the peripheral circuits of the semiconductor memory device cannot reduce the power consumption of the semiconductor memory device because a large, wasteful current flows to the decoder circuits in a non-selected condition and less current flows to the decoder circuit in a selected condition.

SUMMARY OF THE INVENTION

The primary object of the present invention is to provide a decoder circuit featuring a greater reduction in the power consumption of a semiconductor memory device when the decoder circuit is in a non-selected condition.

Another object of the present invention is to provide a semiconductor memory device with a means of reducing the power consumption of the device by using the decoder circuit of the present invention.

In accordance with the present invention, there is provided a decoder circuit as a peripheral circuit of a semiconductor memory device comprising; first and second voltage terminals; a NOR gate circuit comprising a plurality of inverter transistors for receiving address and signals connected in parallel between the first voltage terminal and a common output node, and a positive feedback transistor, for positively feeding back a signal on the common output node, is operatively connected between the second voltage terminal and the common output node; and means, operatively connected between the second voltage terminal and the common output node, for conductively connecting the second voltage terminal to the node for a predetermined period in response to the changing of the address signals.

In accordance with the structure of the present invention, it is possible to greatly reduce the power consumption of the decoder circuit used as one of the peripheral circuits constituting the semiconductor memory device, whereby the power consumption of the semiconductor memory device can also be considerably reduced compared with that of a conventional semiconductor memory device.

DESCRIPTION OF THE PREFERRED EMBODIMENTS

Figure 1:
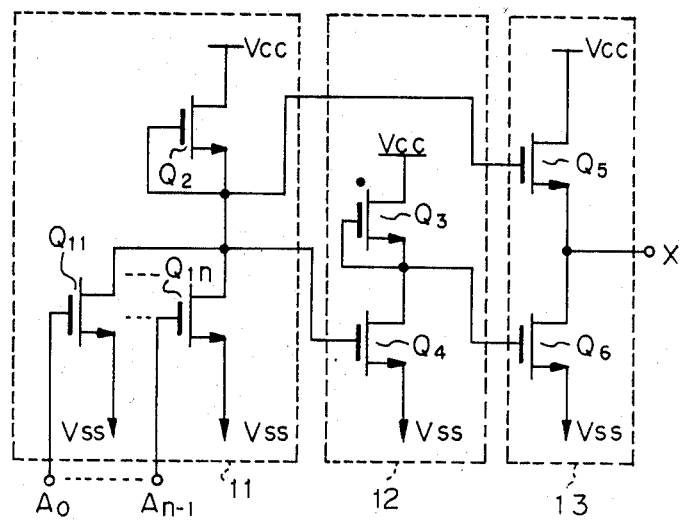
FIG. 1 is a basic circuit diagram of a conventional decoder circuit.

Before describing the preferred embodiment of the present invention, a detailed explanation is given of a prior art circuit as background. A prior art decoder circuit used as an address decoder in a MOS-static RAM is shown in FIG. 1. Referring to FIG. 1, the decoder circuit consists of; a NOR gate circuit 11 including of a plurality of parallel connected inverter transistors ($Q_{11}$ to $Q_{ln}$) controlled by address signals ($A_0$ to $A_{n-1}$) and a load transistor $Q_2$. The decoder also includes an inverter circuit 12 consisting of a load transistor $Q_3$ and an inverter transistor $Q_4$, and an output circuit 13 consisting of a transistor $Q_5$ and a transistor $Q_6$. As many as $2^n$ unit decoder circuits as shown in FIG. 1 are usually provided along rows or columns in a memory device to enable the selection of any one of $2^n$ selection lines, i.e., word (row) or column lines. Each decoder circuit receives a unique combination of n bit address signals among 2n bit complementary signals generated from external n bit address signals. Since such an overall structure of a decoder in a memory device is well known in the art and the present invention is directed to an improvement in the structure of the unit decoder circuit, only one unit decoder circuit is represented hereinafter and is referred to simply as a decoder circuit.

In this conventional decoder circuit, only when all bits of the address signals ($A_0$ to $A_{n-1}$) applied thereto are at a low level, the decoder circuit 1 is set to a selected condition, all inverter transistors ($Q_{11}$ to $Q_{ln}$) turn off, and the output of the NOR gate circuit 11 is set to a high level. At the same time, the inverter transistor $Q_4$ of a next stage turns on and the output X of the decoder circuit is set to a high level. When the output X of the decoder circuit is set to a high level, the selection line (not shown) to be controlled by this output signal is selected. When at least one bit of the address lines ($A_0$ to $A_{n-1}$) is at a high level, the decoder circuit is set to a non-selected condition, and the inverter transistors ($Q_{11}$ to $Q_{ln}$) corresponding to high level bits of the address signal turn on, and the output of the NOR gate circuit 11 is set to a low level. Accordingly, the inverter transistor $Q_4$ of the next stage turns off, and the output X of the decoder circuit is set to a low level. When the output X of the decoder circuit is set to a low level, the selection line (not shown) controlled by the decoder circuit is in a nonselected state.

As mentioned above, in the conventional decoder circuit, all inverter transistors ($Q_{11}$ to $Q_{ln}$) of the NOR gate circuit 11 turn off only in the selected decoder circuit in which no current flows in the NOR gate circuit 11. Meanwhile, in each of the non-selected decoder circuits which amount to $2^n - 1$ in number, at least one of the inverter transistors ($Q_{11}$ to $Q_{ln}$) turns on, so that current flows from the load transistor $Q_2$ to the turned on inverter transistors in the NOR gate circuit 11. That is, in the conventional decoder circuit shown in FIG. 1, no current flows constantly in only the one decoder circuit in the selected condition, but since current flows constantly in all the rest of the decoder circuits in the non-selected condition, the power consumption becomes large and unnecessary heat is generated.

Accordingly, in order to solve these problems, it is necessary to greatly reduce the power consumption of the peripheral circuits in the semiconductor memory device, such as the decoder circuit.

Figure 2:
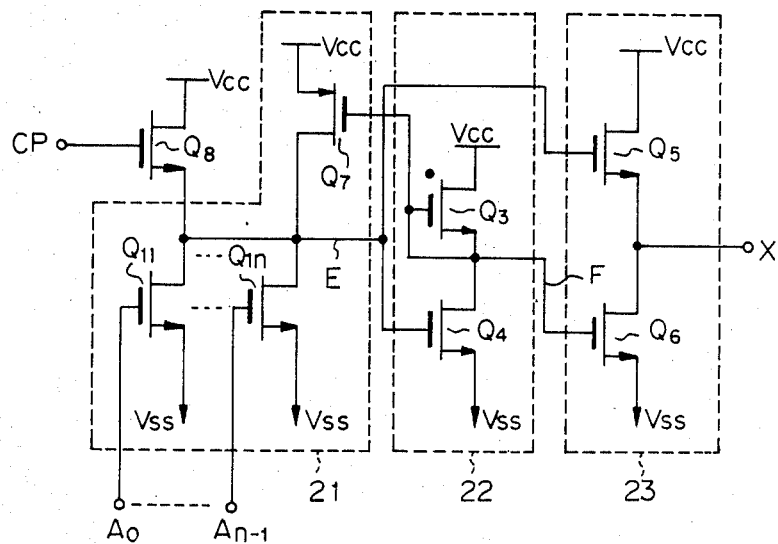
FIG. 2 is a basic circuit diagram of a decoder circuit according to an embodiment of the present invention.

A decoder circuit according to the embodiment of the present invention will now be described. Referring to FIG. 2, the decoder circuit comprises: a NOR gate circuit 21 including a plurality of N-channel MOS type inverter transistors ($Q_{11}$ to $Q_{ln}$) connected in parallel between a common node E and a first voltage terminal $V_{SS}$, and a P-channel MOS type load transistor $Q_7$; an inverter circuit 22 including two N-channel MOS type transistors $Q_3$ an $Q_4$; an output circuit 23 including of two N-channel MOS type transistors $Q_5$ and $Q_6$; and an N-channel MOS type transistor $Q_8$ connected between an output point E of the NOR gate circuit 21, i.e., common node E of the drain of the inverter transistors ($Q_{11}$ to $Q_{ln}$), and a second voltage terminal $V_{CC}$. A clock pulse generated in correspondence with the changing of the address signals ($A_0$ to $A_{n-1}$) is applied to a gate of the transistor $Q_8$.

Figure 3:
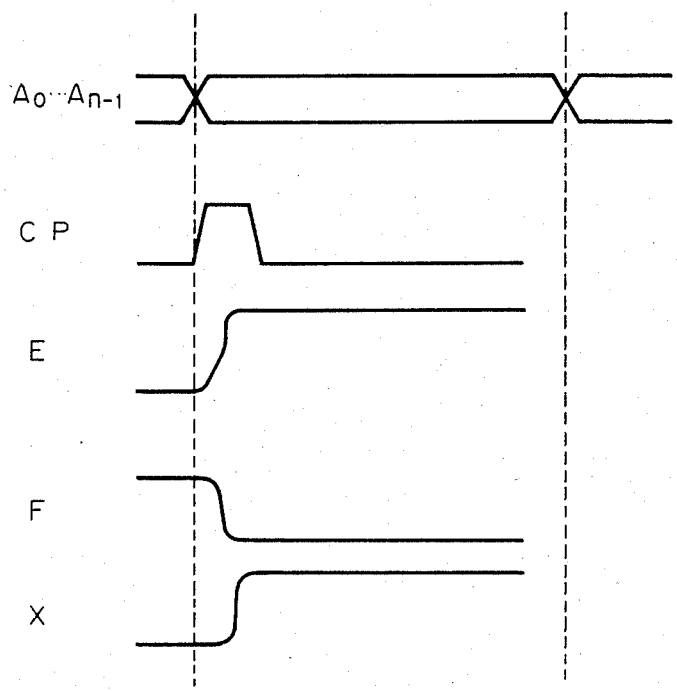
FIG. 3 is a waveform chart at points $A_0 \ldots A_{n-1}$, CP, E, F, and X of the decoder circuit shown in FIG. 2.

In this decoder circuit, when all bits of the address signals ($A_0$ to $A_{n-1}$) are at a low level, the decoder circuit is set to a selected condition. In this selected condition, when the clock pulse CP is set to a high level for a predetermined short period or transistory period in response to the changing of the address signals ($A_0$ to $A_{n-1}$), shown in FIG. 3, the transistor $Q_8$ is turned on for the period by the clock pulse CP.

Meanwhile, the level of the output point E of the NOR gate circuit 21 is pulled up to a high level by the transistor $Q_8$ which is conductive during this period because all inverter transistors ($Q_{11}$ to $Q_{ln}$) turn off at this time. Since the level of the output point E is pulled up to a high level, the transistor $Q_4$ of the inverter circuit 22 turns on and the node F i.e., the drain of the transistor $Q_4$, is set to a low level. When the node F is set to a low level, the load transistor $Q_7$ of the NOR gate circuit 21 turns on because the load transistor $Q_7$ is a P-channel MOS type transistor, and the potential of the node E is maintained at a high level. That is, the circuit including the node E, the transistor $Q_4$ and the transistor $Q_7$ comprises a positive feed back loop, and the level of the node E is latched to a high level. After the short period, even if the clock pulse CP is set to a low level and the transistor $Q_8$ turns off, the level of the node E is maintained at a high level. Accordingly, the output X of the decoder circuit is maintained at a high level. When the output X of the decoder circuit is set to a high level, the row or column selection line (not shown) connected thereto is in a selected condition.

Meanwhile, when at least one bit of the address lines ($A_0$ to $A_{n-1}$) is set to a high level from a low level, the decoder circuit is set to a non-selected condition. At the same time, any of the inverter transistors ($Q_{11}$ to $Q_{ln}$) corresponding to a high level address turn on, and the level of the node E is pulled down to a low level. When the level of the node E is set to a low level, the transistor $Q_4$ turns off and the level of the node F is set to a high level, the transistor $Q_7$ turns off, and the potential of the node E is maintained at a low level. Since the node F is at a high level, the transistor $Q_6$ turns on and the output X of the decoder circuit is set to a low level. When the output X of the decoder circuit is set to a low level, the row or column line (not shown) connected thereto is in a non-selected condition. Moreover, even if the potential of the node E is pulled up to a half level or a high level temporarily, by the clock pulse CP based on the timing of the address signal in a non-selected condition, the potential of the node E is clamped to a low level after the clock pulse CP is set to a low level because at least one of the inverter transistors ($Q_{11}$ to $Q_{ln}$) is always turned on.

As mentioned above, in the case of the decoder circuit according to the present invention, since all the inverter transistors ($Q_{11}$ to $Q_{ln}$) turn off when the decoder circuit is in a selected condition, no constant current flows through the NOR gate circuit 21, as in the conventional NOR gate decoder circuit. By contrast, since the load transistor $Q_7$ turns off when the decoder circuit is in a non-selected condition, and the transistor $Q_8$ turns off in the normal condition, no constant current flows through the NOR gate circuit 21, which is different from the conventional NOR gate decoder circuit. Accordingly, in the decoder circuit according to the present invention, since no constant current flows through the NOR gate between the two power supply lines $V_{CC}$ and $V_{SS}$ when the decoder circuit is in a non-selected condition, the power consumption of the decoder circuit can be drastically reduced compared with a conventional decoder circuit.

Figure 4A:
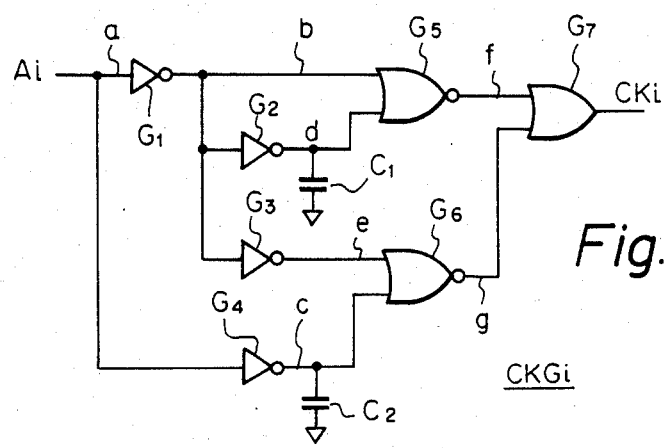
FIG. 4A is a basic circuit diagram of a clock pulse generator used in the decoder circuit shown in FIG. 2.
Figure 4B:
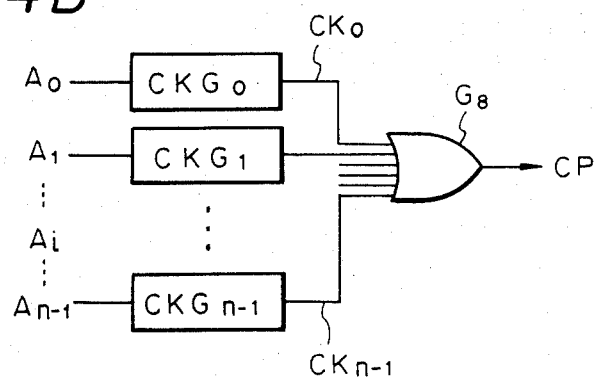
FIG. 4B is a block diagram of the overall structure using a plurality of clock pulse generators corresponding to each of the address signals.

Referring to FIGS. 4A and 4B, the clock pulse generator $CKG_i$ comprises: a plurality of inverters ($G_1$ to $G_4$), two NOR gates ($G_5$ and $G_6$), capacitors ($C_1$ and $C_2$), and an OR gate $G_7$. This pulse generator $CKG_i$ is provided for generating the clock pulse CP in response to the change from a high level to a low level, or from a low level to a high level, in any bit of the address signals ($A_0$ to $A_{n-1}$). When one bit of the address signal $A_i$ applied to the inverter $G_1$ changes, the clock pulse $CK_i$ is generated from the output of the OR gate $G_7$, and this clock pulse $CK_i$ is applied to the gate of the transistor $Q_8$. As shown in FIG. 4B, a plurality of clock pulse generators ($CKG_0$ to $CKG_{n-1}$) are provided, one for each of the address signals, each of the outputs of the clock pulse generator ($CKG_0$ to $CKG_{n-1}$) is applied to the input of the OR gate $G_8$, and the clock pulse CP is generated from the OR gate $G_8$ and applied to the transistor $Q_8$.

Figure 4C:
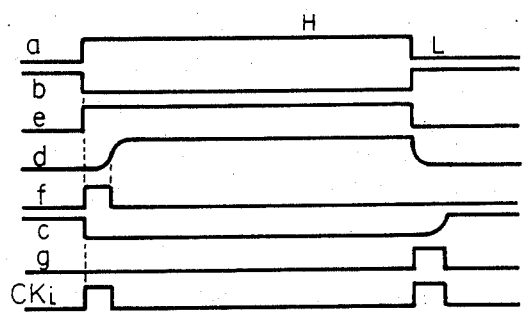
FIG. 4C is a waveform chart at points a to g, and $CK_i$ of the clock pulse generator shown in FIG. 4A.

Referring to FIG. 4C, each waveform (a to g, and $CK_i$) illustrates the waveform at each point of the clock pulse generator $CKG_i$ shown in FIG. 4B. When one bit of the address signal $A_i$ is inverted from a low level to a high level as shown in "a", the output of the inverter $G_1$ is as shown in "b", and the output of the inverter $G_2$ is set to the inverted output "d" delayed due to the capacitor $C_1$, and the output "f" of the NOR gate $G_5$ is set to the clock pulse generating level at the leading edge of the bit of the address signal $A_i$. The inverters $G_3$ and $G_4$, the capacitor $C_2$, and the NOR gate $G_6$ operate at the same time as the above-mentioned process, and the output "g" is set to the pulse generating level at the trailing edge of the bit of the address signal A. Both outputs "f" and "g" are applied to the inputs of the OR gate $G_7$, and the clock pulse $CK_i$ occurs at the time of the changing of the bit of the address signal $A_i$. Accordingly, the output of the OR gate $G_8$ causes the clock pulse CP to occur at the time of the changing of at least one bit of the address signal. The delay time caused by the capacitors $C_1$ and $C_2$ determines the period during which the clock pulse CP is generated.

I claim:

1. A decoder circuit used in a semiconductor memory device, comprising:
   first and second voltage terminals;
   a NOR gate circuit comprising:
      a common output node;
      a plurality of first transistors of a first channel conductivity type connected in parallel between said first voltage terminal and said common output node for receiving address signals, and effecting an inverting logic operation, respectively; and
      a second transistor of a second channel conductivity type, connected between said second voltage terminal and said common node, for positively feeding back a signal produced on said common output node;
   an inverter circuit, having an input node connected to said common output node and having an output node operatively connected to said second transistor, for producing an inverted signal of said signal on said common output node at said output node;
   a third transistor, operatively connected between said second voltage terminal and said common output node, for conductively connecting the second voltage terminal to the common output node for a predetermined period in response to the changing of the address signals; and
   an output circuit comprising fourth and fifth transistors of the first channel conductivity type connected in series between said first and second voltage terminals, said fourth transistor having a gate connected to said common output node, said fifth transistor having a gate connected to the output node of said inverter circuit, and said second transistor pulling up the voltage at said common output node by which said fourth transistor is driven when all of said first transistors turn off.

2. A decoder circuit as claimed in claim 1, wherein said second transistor is of a P-channel MOS type and said first transistors are of an N-channel MOS type.

3. A decoder circuit, comprising:
   a NOR gate comprising gate transistors operatively connected to effect an inverting logic operation, operatively connectable to receive address signals and commonly connected to a common node;
   a load transistor operatively connected to the common node;
   transistory signal generation means, operatively connected to the common node, for generating a transitory signal on the common node when at least one of the address signals change;
   feedback means, operatively connected to said load transistor and the common node, for feeding back and latching the transitory signal, through said load transistor as a selection signal on the common node and outputting an inverted selection signal, said load transistor and said feedback means enhancing a leading edge of the selection signal; and
   an output circuit, connected to said common node and said feedback means, for producing an output signal from the signal on the common node and the inverted selection signal, said output circuit comprising first and second output transistors connected in series, said first output transistor having a gate connected to said common node, and said second output transistor having a gate connected to receive the inverted selection signal, said load transistor pulling up the voltage at said common node by which said first output transistor is driven when all said gate transistors turn off.

4. A decoder circuit as claimed in claim 3, wherein said feedback means comprises an inverter circuit connected to the common node and said load transistor.

5. A decoder circuit as claimed in claim 3, wherein said transitory signal generation means comprises:
   a clock pulse controlled transistor operatively connected to the common node; and
   clock pulse generation means, operatively connected to said clock pulse controlled transistor and connectable to receive the address signals, for generating a transitory control signal turning on said clock pulse controlled transistor when at least one of the address signals change.

6. A decoder as claimed in claim 5, wherein said clock pulse generation means comprises:
   an OR gate operatively connected to said clock pulse controlled transistor; and
   clock pulse generator circuits operatively connected to said OR gate and each operatively connectable to receive one of the address signals.

* * * * *